United States Patent

[11] 3,594,649

[72] Inventor Charles Rauch
Sherman Oaks, Calif.

[21] Appl. No. 799,161
[22] Filed Feb. 14, 1969
[45] Patented July 20, 1971
[73] Assignee Minnesota Mining and Manufacturing Company
St. Paul, Minn.

[54] VOLTAGE-CONTROLLED OSCILLATOR
16 Claims, 4 Drawing Figs.

[52] U.S. Cl. 328/150, 307/235, 307/261, 307/271, 328/61, 328/127
[51] Int. Cl. H03k 3/00, H03k 3/72
[50] Field of Search 307/235, 261, 271; 328/127—8, 150, 60, 61

[56] References Cited

UNITED STATES PATENTS

| | | | |
|---|---|---|---|
| 2,952,811 | 9/1960 | Carr | 328/127 X |
| 3,040,273 | 6/1962 | Boff | 328/127 X |
| 3,274,501 | 9/1966 | Heinsen | 328/127 |
| 3,482,116 | 12/1969 | James | 328/127 X |

*Primary Examiner*—Donald D. Forrer
*Assistant Examiner*—John Zazworsky
*Attorney*—Smyth, Roston & Pavitt

ABSTRACT: The disclosure is directed to a voltage-controlled oscillator using a pair of integrators coupled to a pair of voltage comparators and wherein the outputs of the voltage comparators control a flip-flop. The output from the flip-flop is used to alternately control the individual ones of the integrators to operate in response to an analog input signal so as to produce an output signal from the flip-flop which has a frequency in accordance with the input signal to the integrators. In addition, the invention includes the use of a feed forward signal which is coupled to the comparators to control the time of operation of the comparators to compensate for fixed delays in the system.

INVENTOR:
Charles Rauch
By Smyth, Roston & Pavitt
ATTORNEYS

INVENTOR:
Charles Rauch

By Smyth, Roston & Pavitt
ATTORNEYS

VOLTAGE-CONTROLLED OSCILLATOR

The present invention is directed to a voltage-controlled oscillator of the general type using an integrator, a comparator and a switch with a feedback signal from the switch to control the operation of the integrator. Generally, this type of voltage-controlled oscillator uses a single integrator which integrates an input signal, which integrator is coupled to a comparator whereby the comparator produces an output signal when the signal from the integrator reaches a predetermined level. The output from the comparator is coupled to a switching mechanism such as flip-flop. The state of the flip-flop is alternately switched and the output of the flip-flop is coupled back to the integrator to control the direction of the current flow in the integrator. The output from the integrator, therefore, is a triangular waveform and the output from the switch is a square waveform. A major difficulty with this type of a prior art voltage-controlled oscillator is that at high frequencies the switching of the current flow in the integrator cannot occur at a fast enough rate, thereby providing for errors in the turnaround portion of the integrated signal, which errors produce inaccuracies in the output signal.

It is important that the voltage-controlled oscillator produce a signal output which has a straight line linearity relationship between the amplitude of the input signal and the frequency of the output signal. For example, this type of voltage-controlled oscillator may be used as an FM modulator in recording systems, but it is to be appreciated that voltage-controlled oscillators of this type have many different uses. The prior art voltage-controlled oscillators did not provide for this straight line relationship between the amplitude of the input signal and the frequency of the output signal at high frequencies.

The present invention provides for an improved voltage-controlled oscillator by using two integrators wherein each integrator operates at one-half the frequency as would normally be used with a single integrator as in the prior art. When the first integrator is in use, the second integrator is preset to be ready for use. When the first integrator reaches a predetermined level, this level is detected by a comparator and the output from the comparator controls a flip-flop. The output from the flip-flop is used to shut off the first integrator and to turn on the second integrator.

The second integrator now starts to perform the integration function. The first integrator is discharged back to a reference potential such as ground. The discharge portion of the integrator cycle where the signal is not accurately controlled is not used as part of the system. The second integrator integrates until it reaches the particular level as detected by a second comparator, which second comparator also controls the flip-flop and at that time the flip-flop is reversed to turn off the second integrator and turn on the first integrator, which first integrator has been preset in the same manner as above. The present system, therefore, provides for a much more accurate control of the flip-flop wherein the period when the integrators are being discharged is not used as part of the system to produce the output signal.

As a further refinement in the system of the present invention, means causes provided to compensate for fixed periods of delay in the system. For example, there is a period of delay when the integrators are turned on before the integrators actually start to respond and there is a period of delay after the integrators have reached the predetermined level before the return signal is produced to turn off the integrators. These delays are fixed, no matter what the frequency of the output signal. It can, therefore, be seen that as the frequency of the output signal increases, the delays form a more proportional part of the output signal which in turn causes a nonlinearity between the amplitude of the input signal and the frequency of the output signal. Because the total delay is fixed, the effects of the nonlinearity are proportional to the amplitude of the input signal. The present invention includes the use of a feed forward signal which is proportional to the input voltage to compensate for the fixed delay by adjusting the trigger point in the comparators to eliminate the nonlinearity effects caused by the fixed delay.

A clearer understanding of the invention will be had with reference to the following description and drawings wherein.

Figure 1:
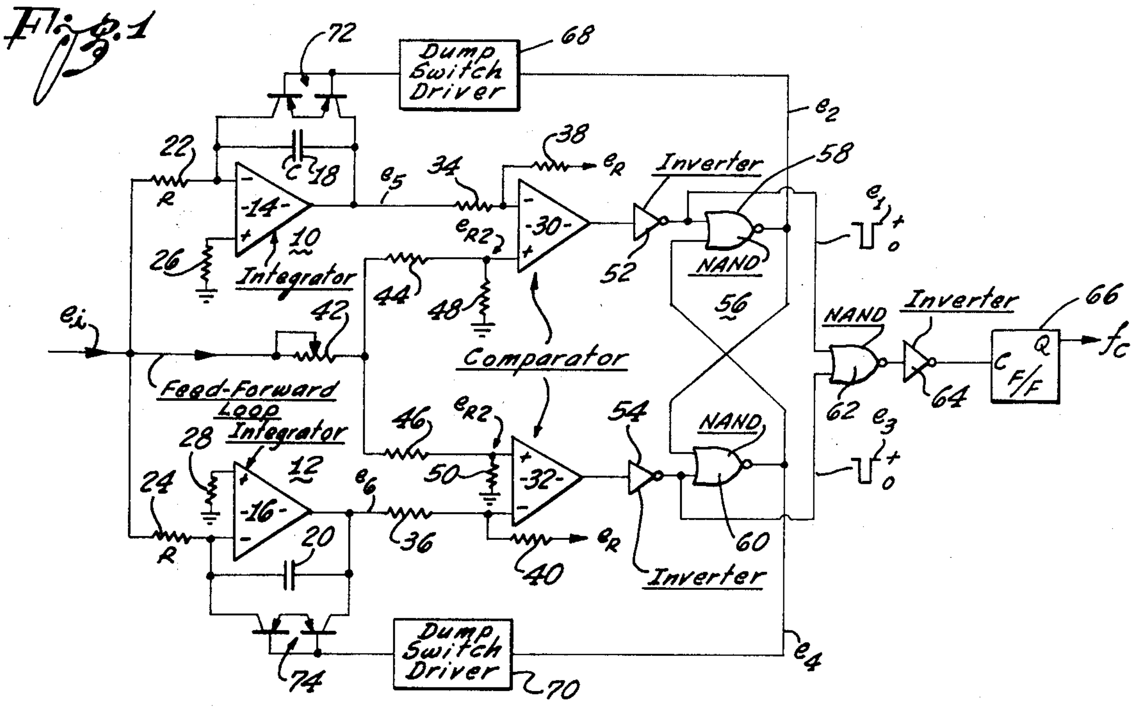
FIG. 1 illustrates a block diagram of a first embodiment of the invention.

In FIG. 1, the block diagram of a variable voltage-controlled oscillator constructed in accordance with the teachings of the present invention is shown and includes a pair of integrators 10 and 12 which consist of operational amplifiers 14 and 16 and capacitors 18 and 20. An input signal, as shown by the signal $e_i$ is fed into the inputs of the operational amplifiers 14 and 16 through resistors 22 and 24. The input signal $e_i$ is an analog input signal which has a variable voltage. The operational amplifiers 14 and 16 are also coupled through resistors 26 and 28 to a reference potential such as ground.

The output from the integrators 10 and 12 is coupled to first input terminals of a pair of voltage comparators 30 and 32 through a pair of resistors 34 and 36. In addition to the inputs from the integrators 10 and 12, the first input terminals of the voltage comparators 30 and 32 receive a fixed voltage from a voltage source $e_R$ which is coupled to these first input terminals through a pair of resistors 38 and 40. Second input terminals of the voltage comparators 30 and 32 receive a signal proportional to the input signal $e_i$ through a variable resistor 42 and fixed resistors 44, 46, 48 and 50.

The outputs from the voltage comparators 30 and 32 are coupled through inverters 52 and 54 to be used as set and reset inputs to a flip-flop 56. The flip-flop 56 consists of a pair of interconnected NAND gates 58 and 60. Also, the outputs from the inverters 52 and 54 are coupled to a NAND gate 62. The output from the NAND gate 62 is coupled through an inverter 64 and used as an input to a flip-flop 66. The output from the flip-flop 66 at terminal Q is the output signal $f_c$.

It can also be seen that the output from the flip-flop 56 is used to control switch drivers 68 and 70. These switch drivers 68 and 70 control the operation of switches 72 and 74 located across the integrators 10 and 12 wherein each switch 72 and 74 includes a pair of transistors. It is noted that at various points in the system of FIG. 1 notations are used such as $e_1$ through $e_7$ plus $e_i$, $e_R$ and Q. These notations are used in the explanation of the operation of the system of FIG. 1 and will be clearer with reference to the waveforms shown in FIG. 2 and the graph shown in FIG. 3.

Figure 2:
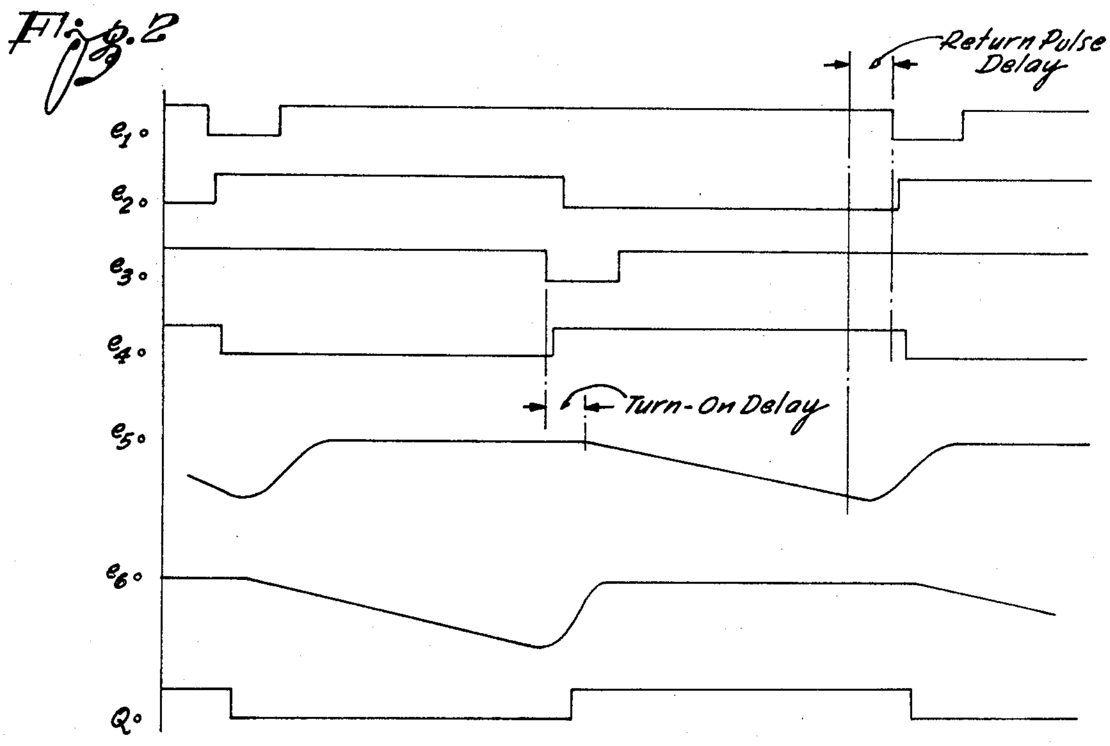
FIG. 2 illustrates a series of waveforms which are used in explaining the operation of the system of FIG. 1.

As shown in FIG. 2, the various waveforms $e_1$ through $e_6$ and Q are shown. It can be seen that the signals $e_1$ and $e_3$, which are provided at the output of the inverters 52 and 54, are used as inputs to the NAND gate 62 and ultimately provide for an output signal from the flip-flop 66 in accordance with these signals $e_1$ and $e_3$. It can be seen that the pulses in the signals $e_1$ and $e_3$ alternate between these two signals. The signals $e_2$ and $e_4$ are used as control signals for the switch drivers 68 and 70. Actually, either one of the signals $e_2$ and $e_4$ may be used directly as an output signal. However, there is a slight inaccuracy in that a fixed delay is included within the signals $e_2$ and $e_4$ but this delay is small and may be ignored. The signals $e_2$ and $e_4$ are substantially the opposite of each other, except that there are slight time differences as shown in FIG. 2 because of fixed delays in the system. The signals $e_5$ and $e_6$ illustrate the outputs from the integrators 10 and 12. The signal Q is the output signal from the flip-flop 66.

Now turning specifically to the system as shown in FIG. 1 as explained with reference to the waveforms shown in FIG. 2, and assuming first that the integrator 10 has been preset and that the output from the integrator 10 is substantially at a zero potential, this condition may be seen with reference to FIG. 2 where the waveform $e_5$ is at a zero potential as shown by the flat portion of waveform $e_5$. At this time, the integrator 12 is operating as shown by the downward sloping curve portion of waveform $e_6$. At a particular trigger point the comparator 32 operates to provide an output signal through the inverter 54. The output signal from the inverter 54 is represented by the pulse signal $e_3$. Also, the signal from the inverter 54 controls the NAND gate 60 to switch the flip-flop 56 to the opposite state. The flip-flop 56, therefore, produces output signals as shown by the voltage waveforms $e_2$ and $e_4$.

The $e_4$ signal rises to control the switch driver 70 to close the switch 74. The closing of the switch 74 shorts out and discharges the capacitor 20. When the capacitor 20 is discharged, the output from the integrator 12 is as shown by the portion of the waveform $e_6$ which curves upwardly to the zero potential and this portion of the waveform $e_6$ is inaccurate and difficult to control. It is an important aspect of the invention that this inaccurate discharge portion of the waveform is not used in the system to produce the output signal.

While the integrator 12 is being switched off, the integrator 10 is being switched on. The switching on of the integrator 10 is determined by the signal $e_2$ which controls the switch driver 68 to open the switch 72 and after some period of delay the integrator 10 begins to integrate as shown by the linearly decreasing portion of the waveform $e_5$. This process of alternating back and forth between the integrators continues but at all times the turnaround portion of the output signal from the integrators is not used.

It can be seen from the waveforms of FIG. 2 that there are certain delays in the system. For example, taking the waveform $e_3$, which is the input to the flip-flop 56, it can be seen first that there is a slight delay before the output from the flip-flop as represented by the waveform $e_4$ occurs, and there is even a further delay before the output from the flip-flop as represented by the waveform $e_2$ occurs. In addition, there are other delays in the system, such as the delay before the driver 68 may control the switch 72 to allow the integrator to integrate. Therefore, it can be seen, as shown in FIG. 2, that there is a total turn-on delay from the time of the start of the signal $e_3$ and until integrator 10 starts to integrate. This is shown in FIG. 2 by the time period marked Turn-on Delay. There is also a Return Pulse Delay, which is also marked in FIG. 2. The return pulse delay is the delay between the time the comparator, such as the comparator 30, is activated until the time that the output signal from the comparator 30 and the inverter 52 forms the signal $e_1$. This delay again is as shown in FIG. 2.

These fixed delays cause inaccuracies in the output signal and specifically cause inaccuracies in the frequency of the output signal with relation to the amplitude of the input signal. Since these delays are fixed for all frequencies, they are a proportional part of the output signal for all frequencies but are a greater proportion for higher frequencies. Because the delays are fixed, however, the effects of this nonlinearity in the output frequency is proportional with the amplitude of the input signal. Therefore, a feed forward signal is produced in the present invention which is proportional to the input voltage and this feed forward signal is used to control the comparators 30 and 32 to adjust the trigger point to compensate for the nonlinearity effects caused by the fixed delays. This compensation may be seen in greater detail with reference to FIG. 3 and the following analysis.

Figure 3:
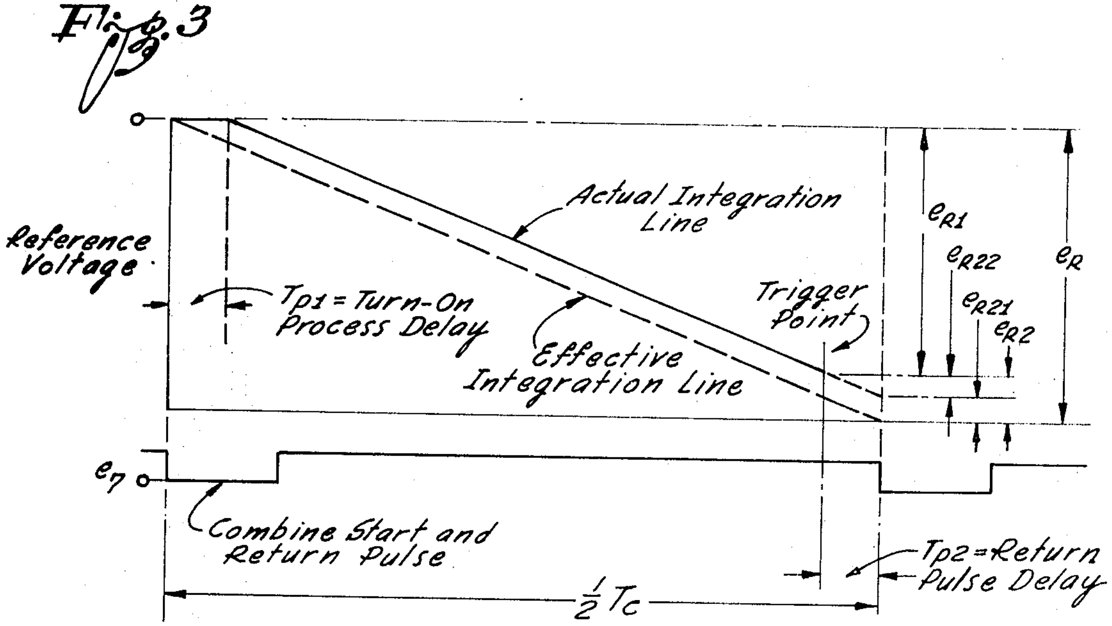
FIG. 3 is a graph used in explaining the feed forward portion of the system of FIG. 1.

In FIG. 3, the reference voltage applied to the voltage comparators 30 and 32, which is identified by $e_R$, is shown to have the maximum value from the start of the start pulse and the start of the return pulse. The combined start and return pulse signal is shown as waveform $e_7$ in FIG. 3. The actual integration line is shown by the solid line and the effective integration line is shown by the dotted line. It can be seen that at the beginning of the start pulse there is some delay before the integration actually occurs. This is identified as the turn-on process delay and is given the symbol $T_{p1}$. At a particular trigger point, again as identified on FIG. 3, the triggering of either one of the comparators occurs. However, there is a delay before the return pulse signal is produced which effectively lengthens the integration time. This return pulse delay is defined in FIG. 3 and has the value as defined by the symbol $T_{p2}$. Various portions of the reference potential $e_R$ are identified by $e_{R1}$, $e_{R22}$, $e_{R21}$ and $e_{R2}$. These are defined in FIG. 3.

From the voltages defined on FIG. 3, $e_{R2}=e_{R21}+e_{R22}$, $e_{R1}=e_R-e_{R2}$ Also from Figure 3

$$\tfrac{1}{2}T_c=T_{p1}+\frac{e_{R1}}{I}C+T_{p2}$$

where I (integrator current) $=\frac{e_i}{R}$,

R is the value of the resistors 22 or 24 shown in FIG. 1, and $$T_{p1}+T_{p2}=T_p \text{ (total delay)}$$

$$\therefore \tfrac{1}{2}T_c=T_p+\frac{e_{R1}}{e_i}RC \qquad (1)$$

As can be seen by the above equation, for the period $\frac{1}{2}T_c$ there is included a fixed value $T_p$ which is the total fixed delay. Even though this delay $T_p$ is fixed, it causes a nonlinearity in the frequency of the output signal with respect to changes in the amplitude of the input voltage. It is, therefore, desirable to eliminate this fixed delay by including a feed forward voltage in the system to compensate for this fixed delay. The required feed forward voltage is derived from the feed forward loop shown in FIG. 1 and where values of resistors 42, 44, 46, 48 and 50 are chosen so that the feed forward loop constants provide the following relationship.

$$e_{R2}=\frac{e_i}{RC}T_p$$

or $$T_p=\frac{e_{R2}}{e_i}RC$$

substituting for $e_{R2}$ $$T_p=\frac{e_R-e_{R1}}{e_i}RC$$

Combining this last equation with the equation marked (1) above, $$\tfrac{1}{2}T_c=\frac{e_R-e_{R1}}{e_i}RC+\frac{e_{R1}}{e_i}RC=\frac{e_R}{e_i}RC$$

$$\therefore f_c=\frac{1}{T_c}=\frac{1}{2e_RRC}e_i$$

It can be seen, therefore, that by using the feed forward signal to control the trigger point in the voltage comparators, the effects of the fixed delay on the output frequency have been eliminated.

Figure 4:
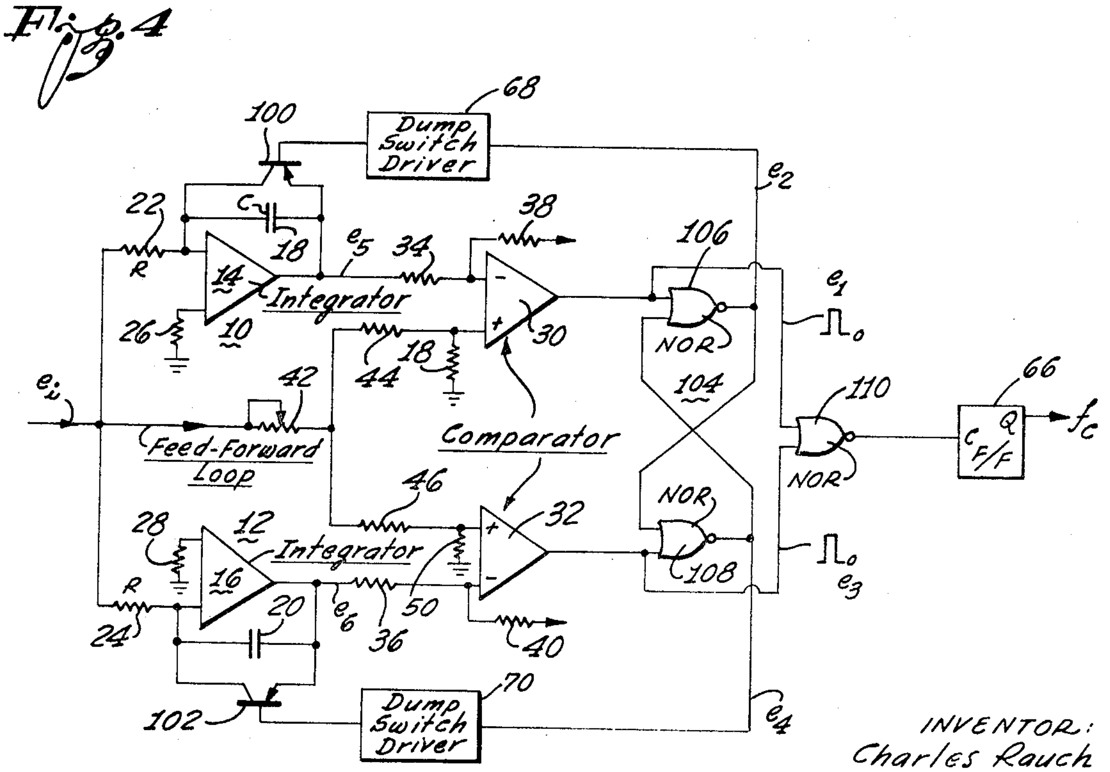
FIG. 4 is a block diagram of a second embodiment of the invention.

FIG. 4 illustrates a second embodiment of the invention and similar elements are given similar reference characters. As can be seen in FIG. 4, the system is essentially similar to that shown in FIG. 1 whereby a pair of integrators 10 and 12 are coupled to comparators 30 and 32. There is also a feed forward loop which is used to control the trigger point of the comparators 30 and 32. Switch drivers 68 and 70 are used to control the operation of the integrators 10 and 12.

In FIG. 4 the switches which are used to control the integrators 10 and 12 are shown to be single transistors 100 and 102. The use of a single transistor switch simplifies the system. The output from the comparators 30 and 32 are directly coupled to a flip-flop 104. The flip-flop 104 consists of a pair of NOR gates 106 and 108. The use of the NOR circuitry also simplifies the system in eliminating the inverters as shown in FIG. 1. The output from the comparators 30 and 32 are also coupled directly though a NOR gate 110 and the output from the NOR gate 110 is used to control the flip-flop 66. It can be seen, therefore, that the system of FIG. 4 is similar to that of FIG. 1 but it has been simplified.

It is also to be noted that with the system of FIG. 4 as with the system of FIG. 1 the output from either of the NOR gates 106 or 108 in FIG. 4 or from the NAND gates 58 or 60 may be directly used as the output signal. These are the signals $e_2$ and $e_4$ shown in FIG. 2 and, although there is a slight time delay error in these signals, the signals $e_2$ and $e_4$ may be sufficiently precise, depending upon the particular application of the voltage controlled oscillator.

The present invention, therefore, is directed to an improved voltage-controlled oscillator using a pair of integrators wherein the individual integrators are preset so that as one integrator reaches a desired trigger point the second integrator is switched to integrate. This eliminates the use of the turnaround portion of the integrator output voltage which can have very imprecise characteristics. In addition, the invention includes the use of a feed forward signal which is used to control a comparator, which feed forward signal compensates for fixed delays in the system by adjusting or modifying the trigger point of the comparator.

Although the invention has been described with reference to particular embodiments, it is to be appreciated that various adaptations and modifications may be made and the invention is only to be limited by the appended claims.

I claim:

1. A voltage-controlled oscillator for producing an output signal having a frequency in accordance with the amplitude of an input signal, including first and second means for integrating the input signal, third and fourth means coupled to the first and second means respectively for producing output signals when the outputs of the first and second means reach a predetermined level, fifth and sixth means coupled to the first and second means respectively for individually controlling the operation of the first and second means, and seventh means coupled to the outputs of the third and fourth means for producing control signals to control the fifth and sixth means and with the fifth and sixth means controlled oppositely to each other to have one of the first and second means operating while the other is not operating and with the other of the first and second means preset while in the nonoperating state.

2. The voltage-controlled oscillator of claim 1 wherein the seventh means is a flip-flop having set and reset input and with the outputs of the third and fourth means coupled to the set and reset inputs respectively.

3. The voltage-controlled oscillator of claim 1 wherein the fifth and sixth means are switches coupled across the first and second means.

4. The voltage-controlled oscillator of claim 1 wherein the third and fourth means are voltage comparators for comparing the outputs of the first and second means with a reference potential.

5. The voltage-controlled oscillator of claim 1 additionally including eighth means responsive to the input signal for coupling a feed forward signal to the third and fourth means for varying the predetermined level in accordance with the input signal to compensate for delays in operation of the various means in the voltage-controlled oscillator.

6. A voltage-controlled oscillator of the type for producing an output signal having a frequency in accordance with the amplitude of an input signal and including an integrator responsive to the input signal for integrating the input signal and a detector responsive to the output of the integrator to produce a control signal when the output of the integrator reaches a predetermined level to control the operation of the integrator, including first means responsive to the input signal for producing a feed forward signal having characteristics in accordance with the amplitude of the input signal, and second means for coupling the feed forward signal to the detector for varying the predetermined level to compensate for delays in the operation of the various components of the voltage-controlled oscillator.

7. The voltage-controlled oscillator of claim 6 wherein the detector is a voltage comparator including a pair of input terminals and wherein the feed forward signal is coupled to one of the input terminals.

8. The voltage-controlled oscillator of claim 6 wherein the voltage-controlled oscillator includes a delay in the starting of the operation of the integrator and a delay in the stopping of the operation of the integrator and wherein the feed forward signal compensates for these delays as they affect the straight line linearity between the frequency of the output signal and the amplitude of the input signal.

9. A voltage-controlled oscillator for producing an output signal having a frequency in accordance with the amplitude of an input signal, including first means for integrating the input signal with reference to a reference potential, second means for integrating the input signal with reference to the reference potential, third means coupled to the first means for producing a first control signal when the output from the first means exceeds a predetermined level, fourth means coupled to the second means for producing a second control signal when the output from the first means exceeds the predetermined level, and fifth means coupled to the first, second, third and fourth means for controlling the first means to integrate when the fourth means produces the second control signal and for controlling the first means to return to the reference potential when the third means produces the first control signal and for controlling the second means to integrate when the third means produces the first control signal and for controlling the second means to return to the reference potential when the fourth means produces the second control signal.

10. The voltage-controlled oscillator of claim 9 wherein the fifth means includes a flip-flop having set and reset inputs and with the outputs of the third and fourth means coupled to the set and reset inputs respectively.

11. The voltage-controlled oscillator of claim 9 wherein the fifth means includes switches coupled across the first and second means.

12. The voltage-controlled oscillator of claim 9 wherein the third and fourth means are voltage comparators for comparing the outputs of the first and second means with a reference potential.

13. The voltage-controlled oscillator of claim 9 additionally including sixth means responsive to the input signal for coupling a feed forward signal to the third and fourth means for varying the predetermined level in accordance with the input signal to compensate for delays in operation of the various means in the voltage-controlled oscillator.

14. A voltage-controlled oscillator for producing an output signal having a frequency in accordance with the amplitude of an input signal and including an integrator responsive to the input signal for integrating the input signal, including a detector responsive to the output of the integrator for producing a control signal when the output of the integrator exceeds a predetermined level to control the operation of the integrator, and means responsive to the input signal for producing a feed forward signal coupled to the detector for varying the predetermined level to compensate for delays in the operation of the voltage-controlled oscillator.

15. The voltage-controlled oscillator of claim 14 wherein the detector is a voltage comparator including a pair of input terminals and wherein the feed forward signal is coupled to one of the input terminals.

16. The voltage-controlled oscillator of claim 14 wherein the voltage-controlled oscillator includes a delay in the starting of the operation of the integrator and a delay in the stopping of the operation of the integrator and wherein the feed forward signal compensates for these delays as they affect the straight line linearity between the frequency of the output signal and the amplitude of the input signal.